(12) United States Patent
Wiederhold et al.

(10) Patent No.: US 11,357,134 B2
(45) Date of Patent: Jun. 7, 2022

(54) DATA CENTER COOLING SYSTEM THAT SELECTIVELY DELAYS COMPRESSOR RESTART OF A MECHANICAL COOLING SYSTEM

(71) Applicant: DELL PRODUCTS, L.P., Round Rock, TX (US)

(72) Inventors: Trey S. Wiederhold, Cedar Park, TX (US); Tyler B. Duncan, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 220 days.

(21) Appl. No.: 16/731,987

(22) Filed: Dec. 31, 2019

(65) Prior Publication Data

US 2021/0204448 A1 Jul. 1, 2021

(51) Int. Cl.
*H05K 7/20* (2006.01)
*F25B 49/02* (2006.01)

(52) U.S. Cl.
CPC ....... *H05K 7/20745* (2013.01); *H05K 7/2079* (2013.01); *F25B 49/022* (2013.01); *F25B 2600/02* (2013.01); *H05K 7/20709* (2013.01); *H05K 7/20836* (2013.01)

(58) Field of Classification Search
CPC ............. H05K 7/20745; H05K 7/2079; H05K 7/20836; H05K 7/20709; F25B 49/022; F25B 2600/02
See application file for complete search history.

(56) References Cited

U.S. PATENT DOCUMENTS

| | | | |
|---|---|---|---|
| 6,832,489 B2 * | 12/2004 | Bash | H05K 7/20836 236/49.3 |
| 6,854,284 B2 * | 2/2005 | Bash | H05K 7/20836 236/49.3 |
| 9,237,681 B2 | 1/2016 | Slessman et al. | |
| 9,970,670 B2 | 5/2018 | Carlson et al. | |
| 10,058,013 B2 | 8/2018 | Schmitt et al. | |
| 10,321,610 B2 | 6/2019 | Ross et al. | |
| 2002/0116075 A1 * | 8/2002 | Salsbury | G05B 13/024 700/1 |
| 2005/0076659 A1 * | 4/2005 | Wallace | F25B 49/022 62/157 |
| 2008/0099570 A1 * | 5/2008 | Krebs | F23N 5/203 236/46 R |

(Continued)

*Primary Examiner* — Leonard R Leo
(74) *Attorney, Agent, or Firm* — Isidore PLLC

(57) ABSTRACT

A multiple mode cooling system circulates outside air through a data center to cool heat-generating information technology (IT) component(s). Based on outside and interior air temperature values and outside humidity value, a controller determines that outside air cooling poses a risk of damage to the heat-generating IT component(s) due to condensation or overheating. Controller also determines that compressor(s) of the cooling system have been inactive for less than a minimum off-time specified for maintaining service life of the compressor(s). In response, controller checks a cooling mode setting and, based on determining that a cooling mode setting indicates an optimization preference for avoiding the posed risk of damage to the heat-generating IT component(s) over compressor service life, the controller restarts the compressor(s) before expiration of the minimum off-time.

19 Claims, 9 Drawing Sheets

(56) References Cited

U.S. PATENT DOCUMENTS

| | | | | |
|---|---|---|---|---|
| 2010/0023171 | A1* | 1/2010 | Bittner | F25B 49/02 |
| | | | | 700/282 |
| 2012/0046797 | A1* | 2/2012 | Grohman | F24F 11/30 |
| | | | | 700/296 |
| 2015/0267953 | A1* | 9/2015 | Hung | F25B 49/005 |
| | | | | 62/115 |
| 2015/0315008 | A1* | 11/2015 | Locke | B67D 1/0888 |
| | | | | 222/52 |
| 2015/0330690 | A1* | 11/2015 | Goel | F25B 7/00 |
| | | | | 62/175 |
| 2016/0018147 | A1* | 1/2016 | Guo | F25B 49/02 |
| | | | | 62/115 |
| 2017/0231118 | A1* | 8/2017 | Cader | H05K 7/20827 |
| 2019/0008076 | A1* | 1/2019 | Ghadiri Moghaddam | |
| | | | | H05K 7/20827 |
| 2021/0180844 | A1* | 6/2021 | Crowe | F25B 5/02 |

\* cited by examiner

DATA CENTER COOLING SYSTEM THAT SELECTIVELY DELAYS COMPRESSOR RESTART OF A MECHANICAL COOLING SYSTEM

BACKGROUND

1. Technical Field

The present disclosure generally relates to a data center having an air cooling system, and in particular to a control system of the air cooling system that performs both outside air and mechanical cooling of the data center.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems that are used in a data center generate heat that require cooling. Cooling the data center often involves a combination of mechanical cooling as the primary method and outside air (OSA) cooling for economization. Mechanical cooling that utilizes compressor(s) has a minimum on-time and minimum off-time to prevent unnecessary wear on the compressor(s) and/or failure of the compressor(s). These time limits are related to movement of a lubricant within the compressor. In the event of a power outage, the cooling system typically will default to outside air (OSA) cooling to accommodate the minimum off-time before the compressor(s) can restart. Continuing with OSA cooling in certain psychrometric conditions can result in condensation forming within the data center which can damage information technology (IT) equipment. Overriding the minimum off-time determined by a manufacturer of the compressor(s) potentially reduces the service life of the compressor(s).

BRIEF SUMMARY

Disclosed are a data center, a multiple mode cooling system of a data center, and a method of selectively delaying restart of compressor(s) of a multiple mode cooling system. The selective delay implements a user preference for either service life of the compressor(s) or avoidance of risk of damage to components within the data center due to outside air cooling. In particular, compressor restart can be delayed or not until a minimum off-time specified for the compressor has expired. The selective delay is based on the user preference to either preserve service life of the compressor(s) or to avoid risk of damage due to condensation or overheating from use of outside air cooling.

According to one embodiment, a method is provided for controlling a multiple mode cooling system of a data center. In one or more embodiments, the method includes circulating outside air through a data center using air handling unit(s) of a cooling system to cool heat-generating information technology (IT) component(s). The method includes tracking a period of time that compressor(s) of a mechanical cooling subsystem of the cooling system are inactive. The compressor(s) have a minimum off-time specified for maintaining a service life of the compressor(s). The method includes monitoring sensor(s) that detect an outside temperature value and an outside humidity value of the outside air and an interior air temperature value of the data center. The method includes, based on the outside and the interior air temperature values and the outside humidity value received from the sensor(s), determining whether outside air cooling poses a risk of damage to the heat-generating IT component(s) due to a selected one of: (i) condensation on the heat-generating IT component(s); and (ii) overheating of the heat-generating IT component(s). The risk of damage is one that is avoidable by using the compressor(s) for mechanical cooling. The method includes, in response to determining that the outside air cooling poses the risk of damage, determining whether the period of time that the compressor(s) has been inactive is equal to or greater than the minimum off-time. The method includes, in response to determining that the period of time is not equal to or greater than the minimum off-time, determining whether a cooling mode setting indicates an optimization preference for avoiding the posed risk of damage to the heat-generating IT component(s) over a compressor service life. The method includes, in response to determining that the cooling mode setting indicates the preference for avoiding the posed risk of damage to the heat-generating IT component(s) over the compressor service life, restarting the compressor(s) to initiate mechanical cooling.

According to a next embodiment, a multiple mode cooling system of a data center is provided that optimizes a compressor restart. The optimization of when to restart the compressor balances preserving service life of the compressor with avoiding damage to heat-generating IT component(s) due to outside air cooling. In one or more embodiments, the multiple mode cooling system includes air handling unit(s) that circulate outside air through a data center to cool heat-generating IT component(s). The multiple mode cooling system includes compressor(s) of a mechanical cooling subsystem, the compressor(s) having a minimum off-time specified for maintaining service life of the compressor(s). The multiple mode cooling system includes sensor(s) that detect an outside temperature value and an outside humidity value of the outside air and an interior temperature value of the data center. The multiple mode cooling system includes a memory containing a minimum off-time value specified for maintaining service life of the compressor(s) and containing a cooling mode application. The multiple mode cooling system includes a controller that is communicatively coupled to the air handling unit(s), the compressor(s), the sensor(s), and the memory. The controller executes the cooling mode application to enable the data center cooling system to circulate outside air through the data center using the air handling unit(s) of the multiple mode cooling system to cool the heat-generating IT component(s). The controller tracks a period of time that the compressor(s) of the mechanical cooling subsystem of the cooling system are inactive. The controller monitors sensor(s) that detect an outside temperature value and an outside humidity value of the outside air and an interior air temperature value of the data center. The controller, based on the outside and the interior air temperature values and the outside humidity value received from the sensor(s), determines whether outside air cooling poses a risk of damage to the heat-generating IT component(s) due to a selected one of: (i) condensation on the heat-generating IT component(s); and (ii) overheating of the heat-generating IT component(s). The risk of damage is avoidable by using the compressor(s) for mechanical cooling. The controller, in response to determining that the outside air cooling poses the risk of damage, determines whether the period of time that the compressor(s) has been inactive is equal to or greater than the minimum off-time. The controller, in response to determining that the period of time is not equal to or greater than the minimum off-time, determines whether a cooling mode setting indicates an optimization preference for avoiding the posed risk of damage to the heat-generating IT component(s) over compressor service life. The controller, in response to determining that the cooling mode setting indicates the preference for avoiding the posed risk of damage to the heat-generating IT component(s) over compressor service life, restarts the compressor(s) to initiate mechanical cooling.

According to another embodiment, a data center optimizes a compressor restart of a multiple mode cooling system. The optimization of when to restart the compressor balances preserving service life of the compressor with avoiding damage to heat-generating IT component(s) due to outside air cooling. The data center includes heat-generating IT component(s) positioned in a volumetric container. A multiple mode cooling system includes air handling unit(s) that circulate outside air through a data center to cool the heat-generating IT component(s). The multiple mode cooling system includes compressor(s) of a mechanical cooling subsystem. The compressor(s) have a minimum off-time specified for maintaining service life of the compressor(s). The multiple mode cooling system includes sensor(s) that detect an outside temperature value and an outside humidity value of the outside air and an interior temperature value of the data center. The multiple mode cooling system includes a memory containing a minimum off-time value specified for maintaining service life of the compressor(s) and containing a cooling mode application. The multiple mode cooling system includes a controller that is communicatively coupled to the air handling unit(s), the compressor(s), the sensor(s), and the memory. The controller executes the cooling mode application to enable the data center cooling system to circulate outside air through the data center using the air handling unit(s) of the multiple mode cooling system to cool the heat-generating IT component(s). The controller tracks a period of time that the compressor(s) of the mechanical cooling subsystem of the cooling system are inactive. The controller monitors sensor(s) that detect an outside temperature value and an outside humidity value of the outside air and an interior air temperature value of the data center. The controller, based on the outside and the interior air temperature values and the outside humidity value received from the sensor(s), determines whether outside air cooling poses a risk of damage to the heat-generating IT component(s) due to a selected one of: (i) condensation on the heat-generating IT component(s); and (ii) overheating of the heat-generating IT component(s). The risk of damage is avoidable by using the compressor(s) for mechanical cooling, instead of using outside air cooling. The controller, in response to determining that the outside air cooling poses the risk of damage, determines whether the period of time that the compressor(s) has been inactive is equal to or greater than the minimum off-time. The controller, in response to determining that the period of time is not equal to or greater than the minimum off-time, determines whether a cooling mode setting indicates an optimization preference for avoiding the posed risk of damage to the heat-generating IT component(s) over compressor service life. The controller, in response to determining that the cooling mode setting indicates the preference for avoiding the posed risk of damage to the heat-generating IT component(s) over compressor service life, restarts the compressor(s) to initiate mechanical cooling.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
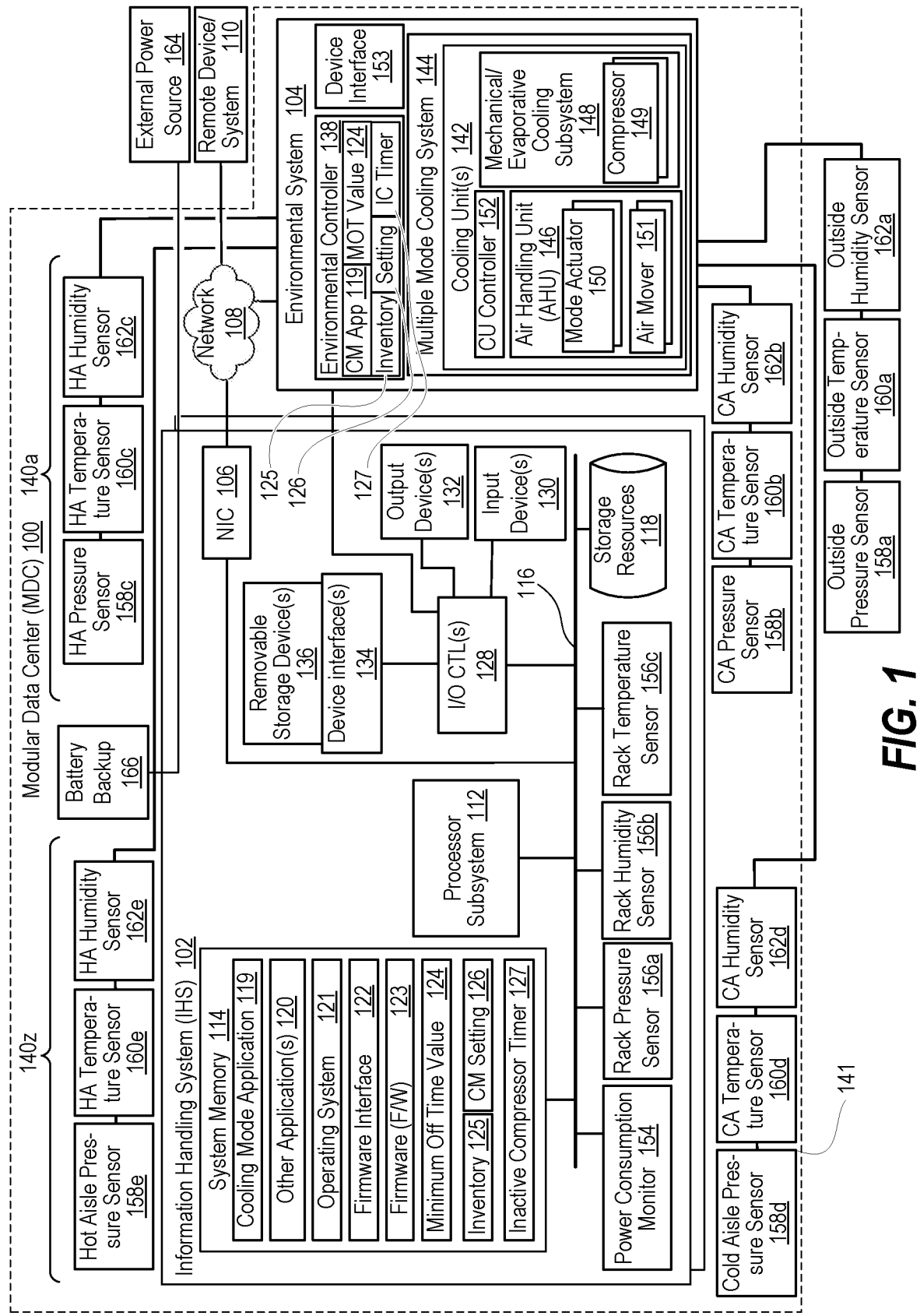
FIG. 1 depicts a simplified functional block diagram of a modular data center (MDC), according to one or more embodiments.

The illustrative embodiments provide a data center, a multiple mode cooling system of a data center, and a method of optimizing a restart of compressor(s) of a multiple mode cooling system. The optimization of when to restart the compressor balances preserving a service life of the compressor with avoiding damage to heat-generating IT component(s) due to outside air cooling. A multiple mode cooling system circulates outside air through a data center to cool heat-generating information technology (IT) component(s). Based on sensed outside and interior air temperature values and an outside humidity value, a controller determines that outside air cooling poses a risk of damage to the heat-generating IT component(s) due to condensation or overheating. The controller determines that compressor(s) of the cooling system have been inactive for less than a minimum off-time specified for maintaining a service life of the compressor(s). In response to determining that a cooling mode setting indicates an optimization preference for avoiding the risk of damage to the heat-generating IT component(s) over the compressor service life, the controller restarts the compressor(s).

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1 depicts a simplified functional block diagram of data center, and in particular a modular data center (MDC) 100 having IT components such as information handling systems (IHSs) 102 with environmental sensors used to control environmental system 104. Within the general context of IHSs, IHS 102 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, IHS 102 may be a server, blade server, rack-mounted server, rack-mounted data storage, or other rack-mounted IT equipment. IHS 102 may include random access memory (RAM), one or more processing resources such as a central processing unit (CPU) or hardware or software control logic, read only memory (ROM), and/or other types of nonvolatile memory. Additional components of the IHS 102 may include one or more disk drives, one or more network ports for communicating with external devices as well as various input and output (I/O) devices, such as a keyboard, a mouse, and a video display. The IHS 102 may also include one or more buses operable to transmit communications between the various hardware components. In one or more embodiments, IHS 102 is rack-mounted to provide computing, communication and storage functionality in mobile MDC 100.

IHS 102 includes a network interface, depicted as network interface controller (NIC) 106, in communication via network 108 for receiving IHS updates and work requests from remote devices and systems 110. NIC 106 enables IHS 102 and/or components within IHS 102 to communicate and/or interface with other devices, services, and components that are located external to IHS 102. These devices, services, and components can interface with IHS 102 via an external network, such as network 108, using one or more communication protocols that include transport control protocol (TCP/IP) and network block device (NBD) protocol. Network 108 can be a local area network, wide area network, personal area network, and the like, and the connection to and/or between network 108 and IHS 102 can be wired, wireless, or a combination thereof. For purposes of discussion, network 108 is indicated as a single collective component for simplicity. However, it should be appreciated that network 108 can comprise one or more direct connections to other devices as well as a more complex set of interconnections as can exist within a local area network or a wide area network, such as the Internet.

A processor subsystem 112 is coupled to system memory 114 via system interconnect 116. System interconnect 116 can be interchangeably referred to as a system bus, in one or more embodiments. System interconnect 116 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus. For the purpose of this disclosure, system interconnect 116 can also be a Double Data Rate (DDR) memory interface. The system memory 114 can either be contained on separate, removable dual inline memory module (RDIMM) devices or system memory 114 can be contained within persistent memory devices (NVDIMMs). For example, the NVDIMM-N variety of NVDIMMs contain both random access memory, which can serve as system memory 114, and non-volatile memory. It should be noted that other channels of communication can be contained within system interconnect 116, including but not limited to i2c or system management bus (SMBus). System interconnect 116 communicatively couples various system components. Examples of system components include replaceable local storage resources 118 such as solid state drives (SDDs) and hard disk drives (HDDs). Software and/or firmware modules and one or more sets of data that can be stored on local storage resources 118 and be utilized during operations of IHS 102. Specifically, in one embodiment, system memory 114 can include therein a plurality of such modules, including cooling mode application 119, other application(s) 120, operating system (OS) 121, a firmware interface 122 such as basic input/output system (BIOS) or Uniform Extensible Firmware Interface (UEFI), and platform firmware (FW) 123. These software and/or firmware modules have varying functionality when their corresponding program code is executed by processor subsystem 112 or secondary processing devices within IHS 102. For example, application(s) 120 may include a word processing application, a presentation application, and a management station application, among other applications. System memory 114 can include computer data structures and data values for use by applications 119, 120 such as minimum off-time value 124, inventory 125, cooling mode setting 126, and inactive compressor timer 127.

IHS 102 further includes one or more input/output (I/O) controllers 128 that support connection by and processing of signals from one or more connected input device/s 130, such as a keyboard, mouse, touch screen, or microphone. I/O controllers 128 also support connection to and forwarding of output signals to one or more connected output devices 132, such as a monitor or display device or audio speaker(s). Additionally, in one or more embodiments, one or more device interfaces 134, such as an optical reader, a universal serial bus (USB), a card reader, Personal Computer Memory Card International Association (PCMCIA) slot, and/or a high-definition multimedia interface (HDMI), can be associated with IHS 102. Device interface(s) 134 can be utilized to enable data to be read from or stored to corresponding removable storage device/s 136, such as a compact disk (CD), digital video disk (DVD), flash drive, or flash memory card. In one or more embodiments, device interface(s) 134 can further include general purpose I/O interfaces such as inter-integrated circuit ($I^2C$), system management bus (SMB), and peripheral component interconnect (PCI) buses.

In one or more embodiments, enclosure 141 is provided by a volumetric container. Environmental system 104, managed by environmental controller 138, provides cooling air to meet the cooling requirements of IHSs 102 in one or more zones 140a, 140z defined within enclosure 141 of MDC 100. The cooling requirements can include specified temperature and humidity ranges for startup, standby and operation of IHSs 102. Operating outside of these ranges can degrade the service life or prevent effective operation of IHSs 102. Multiple mode cooling system 144 of environmental system 104 can be stand-alone units that include air handling unit(s) 146 and evaporative/mechanical cooling subsystems 148. Compressor(s) 149 in evaporative/mechanical cooling subsystems 148 provide heat transfer for multiple mode cooling system 144. Air handling unit(s) 146 have mode actuators 150 that configure air flow for closed loop recirculation, open loop venting with cooling by outside air, or a mixed mode with a partial recirculation of air. The air is moved by air mover(s) 151 of air handling unit(s) 146. Environmental controller 138 can include some or all of the components and functionality described above for IHSs 102. In one or more embodiments, environmental controller 138 acts as supervisory controller to respective control unit controllers 152 that control corresponding cooling unit(s) 142. In one or more embodiments, environmental controller 138 executes cooling mode application 119 to enable multiple mode cooling system 144 to provide the functionality described herein. In one or more embodiments, IHSs 102 can communicate cooling requirements to environmental controller 138, via device interface 153 or network 108, based on values provided by power consumption monitor 154, rack pressure sensor 156a, rack humidity sensor 156b, and rack temperature sensor 156c. For example, the cooling requirement can indicate a temperature set point and a current temperature. As another example, the cooling point can indicate a current heat load being produced by IHSs 102. In one or more embodiments, environmental controller 138 can determine cooling requirements based in part on outside environmental sensors, depicted as outside pressure sensor 158a, outside temperature sensor 160a, and outside humidity sensor 162a. In one or more embodiments, environmental controller 138 can determine cooling requirements for first zone 140a based in part on cold aisle (CA) environmental sensors in first zone 140a, depicted as CA pressure sensor 158b, CA temperature sensor 160b, and CA humidity sensor 162b. In one or more embodiments, environmental controller 138 can determine cooling requirements for first zone 140a based in part on hot aisle (HA) environmental sensors in first zone 140a, depicted as HA pressure sensor 158c, HA temperature sensor 160c, and HA humidity sensor 162c.

In one or more embodiments, environmental controller 138 can determine cooling requirements for second zone 140z based in part on CA environmental sensors in second zone 140z, depicted as CA pressure sensor 158d, CA temperature sensor 160d, and CA humidity sensor 162d. In one or more embodiments, environmental controller 138 can determine cooling requirements for second zone 140z based in part on HA environmental sensors in second zone 140z, depicted as HA pressure sensor 158e, HA temperature sensor 160e, and HA humidity sensor 162e.

Operation of critical components of MDC 100 such as IHS 102 can be maintained during an interruption of an external power source 164 by a battery backup 166. In order to conserve backup power, multiple mode cooling system 144 reverts to outside air cooling mode, deactivating compressor(s) 149. For example, AHUs 146 can include dampers or louvers that automatically open outside air intakes and exhaust vents when electrical power is removed. Battery backup 166 provides power to air mover(s) to circulate outside air through enclosure 141 of MDC 100. Determining whether compressor(s) 149 are restarted when external power is available can depend, at least in part, on minimum off-time value 124 and cooling mode setting 126. Minimum off-time value 124 and cooling mode setting 126 can be provisioned during equipment manufacture. In one or more embodiments, minimum off-time value 124 and cooling mode setting 126 are input by user interacting, via user input device 130, with a graphical user interface providing selectable options for user setting of one or both values (124, 126).

Figure 2:
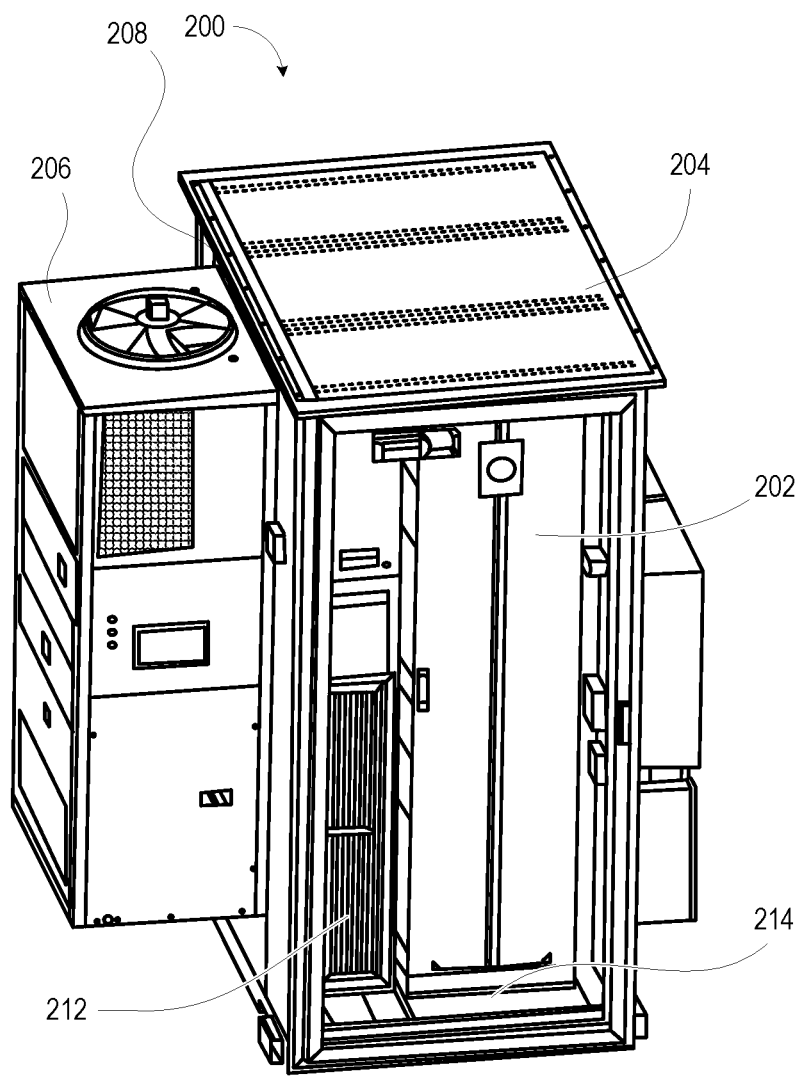
FIG. 2 depicts a three-dimensional top left view of an example MDC, according to one or more embodiments.

FIG. 2 depicts a three-dimensional, top left view of example modular data center (MDC) 200. MDC 200 can be placed in locations where data capacity is needed. MDC 200 consist of purpose-engineered modules and components that offer scalable data center capacity with multiple power and cooling options. Modular edge data centers (MEDCs) are generally smaller MDC facilities that extend the edge of the network to deliver cloud computing resources and cached streaming content to local end users MEDCs that have only one or two racks for IT are also referred to as micro MDCs. Minimizing a footprint of an MEDC, and especially for a micro MDC, enables use in space-constrained applications. Rack Information Handling System (RIHS) 202 is positioned within volumetric container 204. Cooling unit 206 is mounted to rear external wall 208 and directs air internally through volumetric container 204 via air redirection structure 212. Supply air is directed to cold aisle 214.

Figure 3:
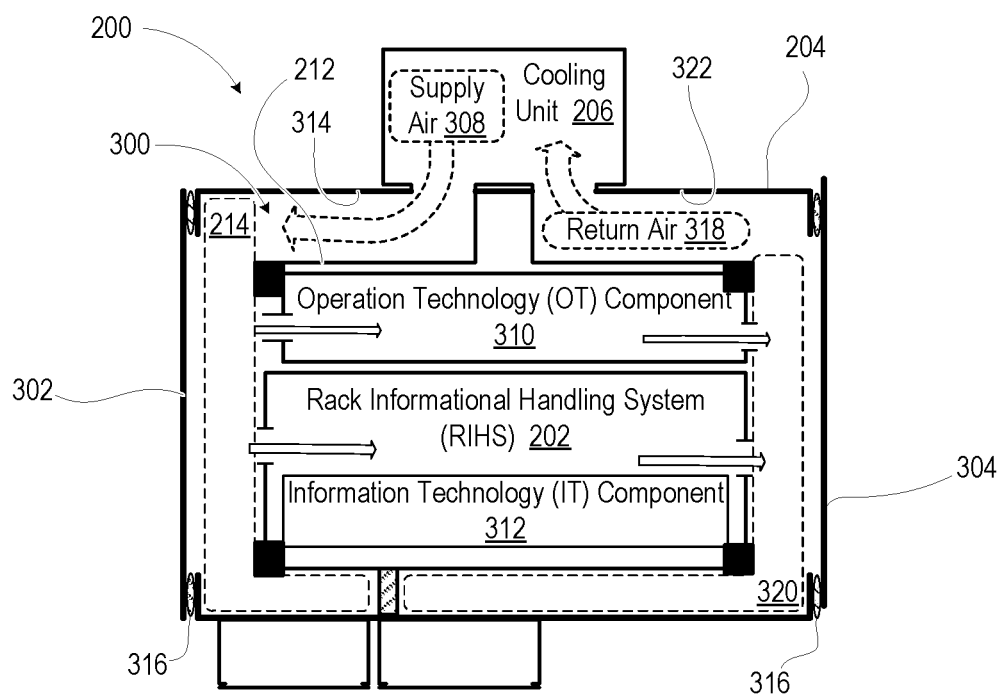
FIG. 3 depicts a top diagrammatic view of air flow patterns in the example MDC, according to one or more embodiments.

FIG. 3 depicts a top diagrammatic view of air flow patterns 300 in example MDC 200 with left and right access doors 302, 304 in a closed position. Cooling unit 206, which is exteriorly coupled to volumetric container 204, provides supply air 308. Cooling unit 206 can prepare supply air 308, which can include recirculated air, outside air, or mixed air. Cooling unit 206 warms, cools, dehumidifies, or humidifies the air, as required for operation technology (OT) components 310 and information technology (IT) components 312 in RIHS 202. For example, cooling unit 206 can cool air using direct evaporative cooling or mechanical cooling. Pressurized supply air 308 is directed by supply air plenum 314 of air redirection structure 212 to cold aisle 214. During normal operation, left and right access doors 302, 304 are sealed with door seals 316 to prevent loss of cooling air. Cooling unit 206 draws return air 318 from hot aisle 320, directed by return air plenum 322 of air redirection structure 212, creating a lower pressure within hot aisle 320 than cold aisle 214. In response to the pressure differential, cooling air is passively drawn through air passages in OT components 310 and RIHS 202.

Figure 4:
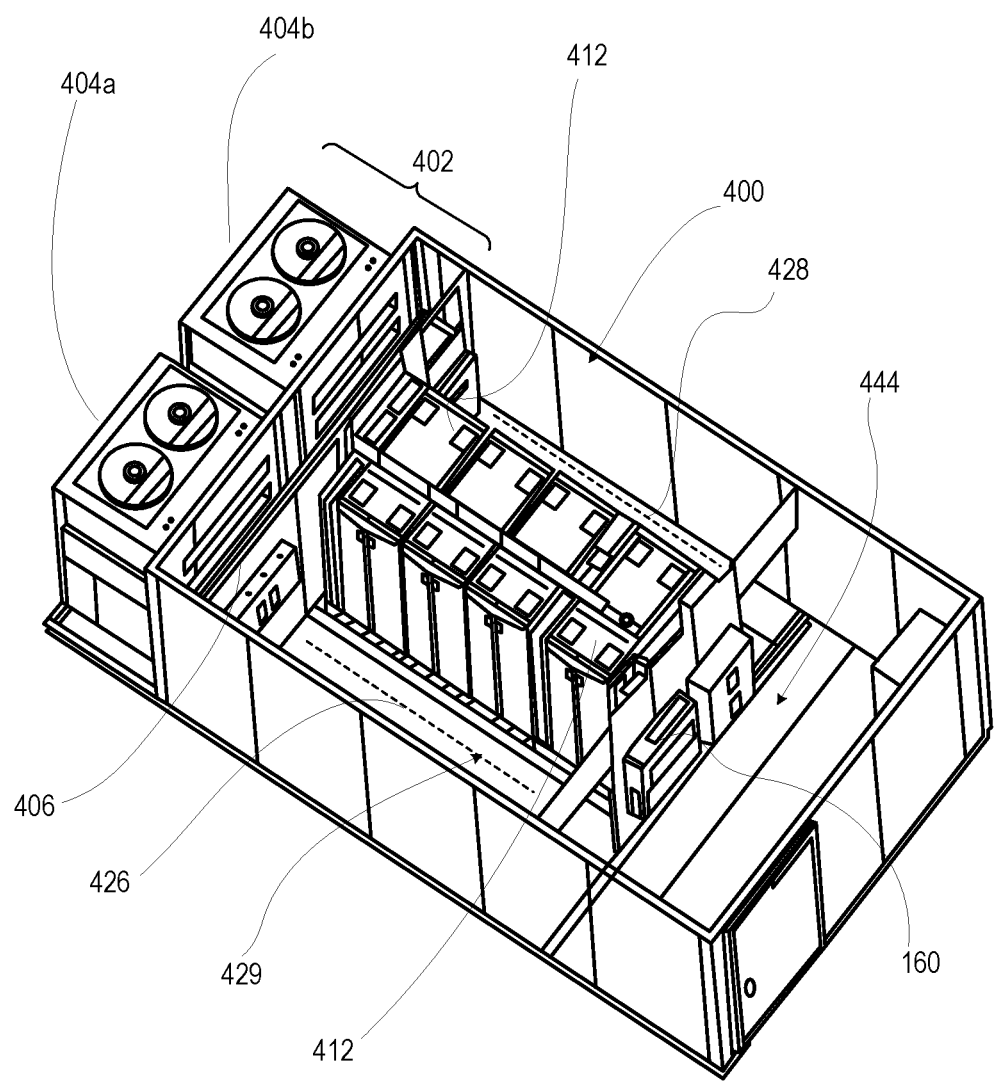
FIG. 4 depicts a three-dimensional, top view of an example MDC that has an information technology (IT) compartment and a utility room, according to one or more embodiments.

FIG. 4 depicts a three-dimensional, top view of example MDC 400 that has IT compartment 429 and utility room 444. IT compartment 429 includes a longitudinal row of IT components 412 between cold and hot aisles 426, 428. Dual-AHU air handling system 402 of MDC 400 includes two forward-mounted or aft-mounted AHUs 404a, 404b. AHUs 404a, 404b exchange cooling air via air redirection structure 406 with the IT compartment 429 and utility room 444 via cold and hot aisles 426, 428. Utility room 444 includes security system 160. MDC 400 is an example MDC. However, aspects of the present disclosure can be applied to data centers housed in institutional buildings, larger MDCs within a single volumetric container, smaller MDCs having one or two racks within a small volumetric container, and MDCs that include multiple volumetric enclosures.

Figure 5:
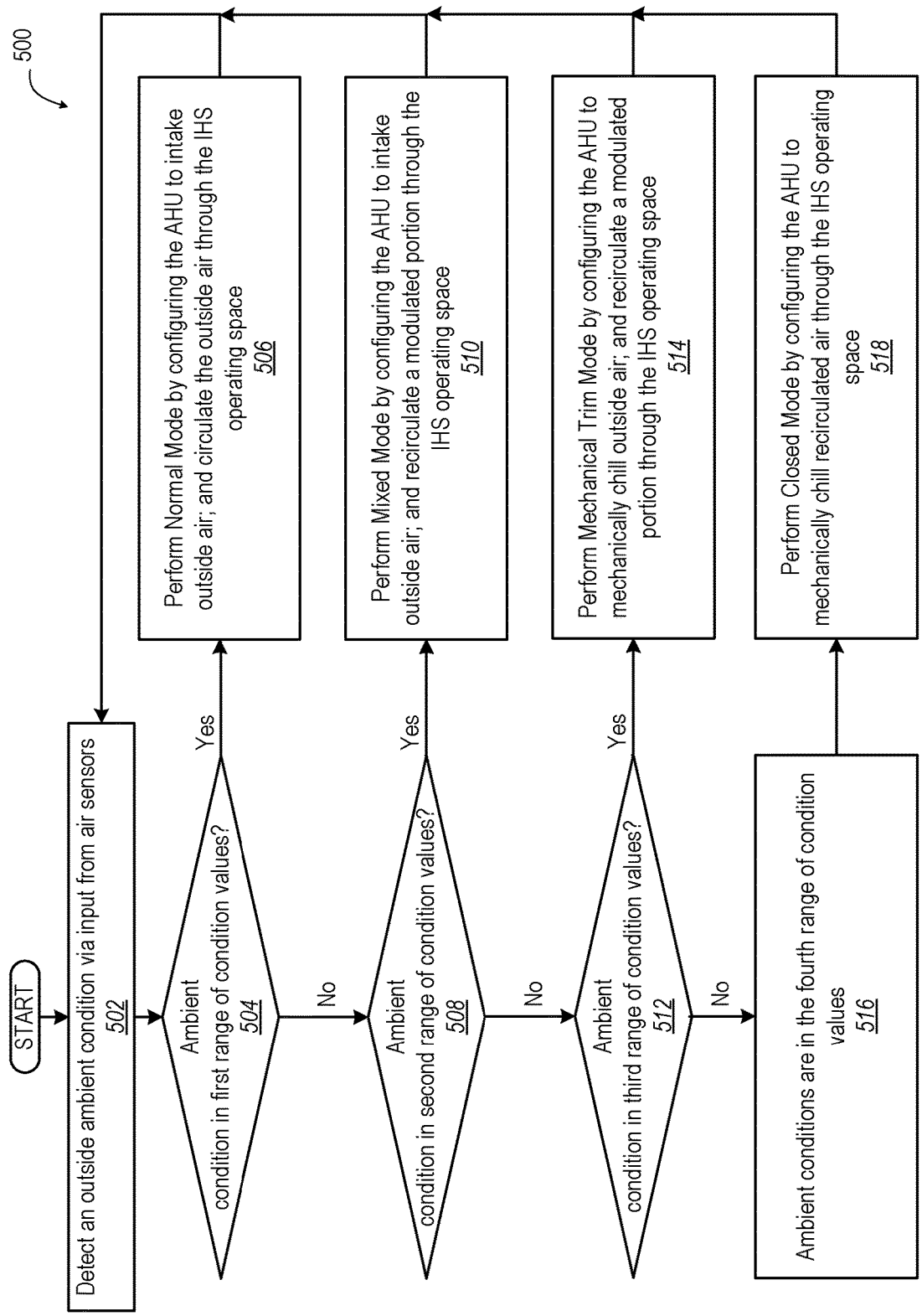
FIG. 5 presents a flow chart of an example method for controlling a multiple mode cooling system of a data center, according to one or more embodiments.

FIG. 5 depicts a method 500 for cooling IT components 412 (FIG. 4) using one of four modes within a data center that has a cooling system. The description of method 500 is provided with general reference to the specific components illustrated within the preceding FIGS. 1-4. In at least one embodiment, method 500 can be implemented using environmental controller 138 (FIG. 1) that operates multiple mode cooling system 144 (FIG. 1). In one embodiment, method 500 includes detecting an outside ambient condition as being in one of four ranges via input from air sensors (block 502). The four ranges are mutually exclusive and should cover the full range of environmental conditions that the MDC should encounter at the operational location. First, a "normal mode" provides open loop cooling with deactivated compressor(s) of a mechanical cooling system. Second, a "mixed mode" provides mixing outside air with recirculated return air that is warmed by the data center. Compressor(s) of the mechanical cooling subsystem are inactive. Third, a "mechanical trim mode" includes mixing of outside air with recirculated return air. However, the compressor(s) of the mechanical cooling subsystem are activated to cool the combined airflow. Fourth, a "closed mode" recirculates all return air with cooling provided by activated compressor(s) of the mechanical cooling subsystem. In one or more embodiments, fewer modes may be required for a particular location, enabling omission of certain environmental components. For clarity, other environmental considerations such as contaminants in the outside air that can affect mode selection are not depicted. The ranges are based at least on outside air temperature and outside air humidity. In one or more embodiments, the four ranges are defined on a psychrometric chart that is tailored for a location of the data center.

Method 500 includes determining whether the outside ambient condition is within a first range of condition values (decision block 504). In response to determining in decision block 504 that the outside ambient condition falls within the first range of condition values, method 500 includes performing normal mode by configuring the AHU 144 (FIG. 1) to intake outside air, circulate the outside air through the data center operating space, and exhaust the warmed air out of the data center (block 506). The AHU is configured by actuating dampers, louvers, or other mechanisms to direct air. Then, method 500 returns to block 502 to monitor the outside ambient condition. Open loop cooling by circulating outside air through the data center is the normal mode in that this cooling mode is the most economical. During open loop cooling, compressor(s) 149 (FIG. 1) are inactive, which reduces operational wear on moving components so long as operating limits for lubricants are complied with. Lubricants within compressor(s) 149 (FIG. 1) need a minimum off-time to drain down and accumulate in preparation for a restart. Even with lubricants having drained down, restarting the compressors creates wear on the components. The minimum on-time for the compressors imposes a requirement that prevents use of the compressor(s) for very short durations. The normal mode is used when an acceptable temperature and humidity range as specified for the IT components is available from the outside air. This mode is also reverted to when mechanical or power failures cause portions of multiple mode cooling system 144 (FIG. 1) to be unavailable for conditioning the inside or the outside air for cooling.

In response to determining in decision block 504 that the outside ambient condition did not fall within the first range of condition values, method 500 includes determining whether the outside ambient condition is within a second range of condition values (decision block 508). The second range corresponds to certain outside temperatures that are too cold and/or humidity values that are too high for unconditioned use. In the second range, the outside air can be made acceptable in combination with a selected amount of recirculated return air that has been warmed within the data center. In response to determining, in decision block 508, that the outside ambient condition is within the second range of condition values, method 500 includes performing mixed mode by configuring the AHU to intake outside air, circulate the outside air through the data center along with a mix of recirculated, warmed air of a modulated amount (e.g., 5-95%), and exhaust the remainder of the warmed air (block 510). The range of recirculated air can be varied between 0-100% with the remainder being exhausted. From block 510, method 500 returns to block 502 as the sensors continually monitor the outside ambient condition.

In response to determining in decision block 508 that the outside ambient condition did not fall within the second range of condition values, method 500 includes determining whether the outside ambient condition is within a third range of condition values (decision block 512). The third range corresponds to certain outside temperatures that are too hot and/or humidity values that are too high for unconditioned use. In the third range, the outside air can be made acceptable by mechanical cooling. Mechanical cooling includes activating the compressor(s) of the mechanical cooling subsystem. In response to determining in decision block 512 that the outside ambient condition is within the third range of condition values, method 500 includes performing the mechanical trim mode by configuring the AHU to intake outside air, circulate the outside air through the data center while mechanically chilling the air, and exhaust the warmed air (block 514). Then, method 500 returns to block 502 to monitor the outside ambient condition. Compressor(s) of the mechanical cooling subsystem are used to directly or indirectly air condition at least a portion of the air routed through a heat exchanger. In one or more embodiments, a chiller system is interposed between the heat exchanger and the compressor(s) of the air conditioning system. Liquid in the chiller system, such as water, is cooled by activating the compressor(s). The chilled water is circulated through the heat exchanger to cool the air.

In response to determining in decision block 512 that the outside ambient condition did not fall within the third range of condition values, method 500 includes determining that the outside ambient condition is within a fourth range of condition values (block 516). The fourth range corresponds to certain combinations of outside temperatures that are too hot and/or humidity values that are too high for mechanical trim mode. The fourth range requires closed loop mechanical cooling. Method 500 includes performing closed mode by configuring the AHU to wholly recirculate air through the data center while mechanically chilling the air (block 518). Then, method 500 returns to block 502 to monitor the outside ambient condition. Closed loop cooling uses the mechanical cooling of the recirculated air, which requires activation of the compressor(s).

Environmental conditions of temperature and humidity outside of the data center change over time as do the cooling requirements of heat-generating components within the data center. As the outside air conditions change from one of the first range for normal mode and the second range for mixed mode to one of the third range for mechanical trim mode and the fourth range for closed mode, the mechanical cooling subsystem is activated, including restarting previously inactive compressor(s). A minimum off-time is specified for the compressor(s) before restart is to occur to preserve service life. As the outside air conditions change from one of the third range for mechanical trim mode and the fourth range for closed mode to one of the first range for normal mode and the second range for mixed mode, the mechanical cooling subsystem is deactivated, including deactivating previously active compressor(s). A minimum on-time is specified for the compressor(s) before deactivating is to occur to preserve service life.

Figure 6A:
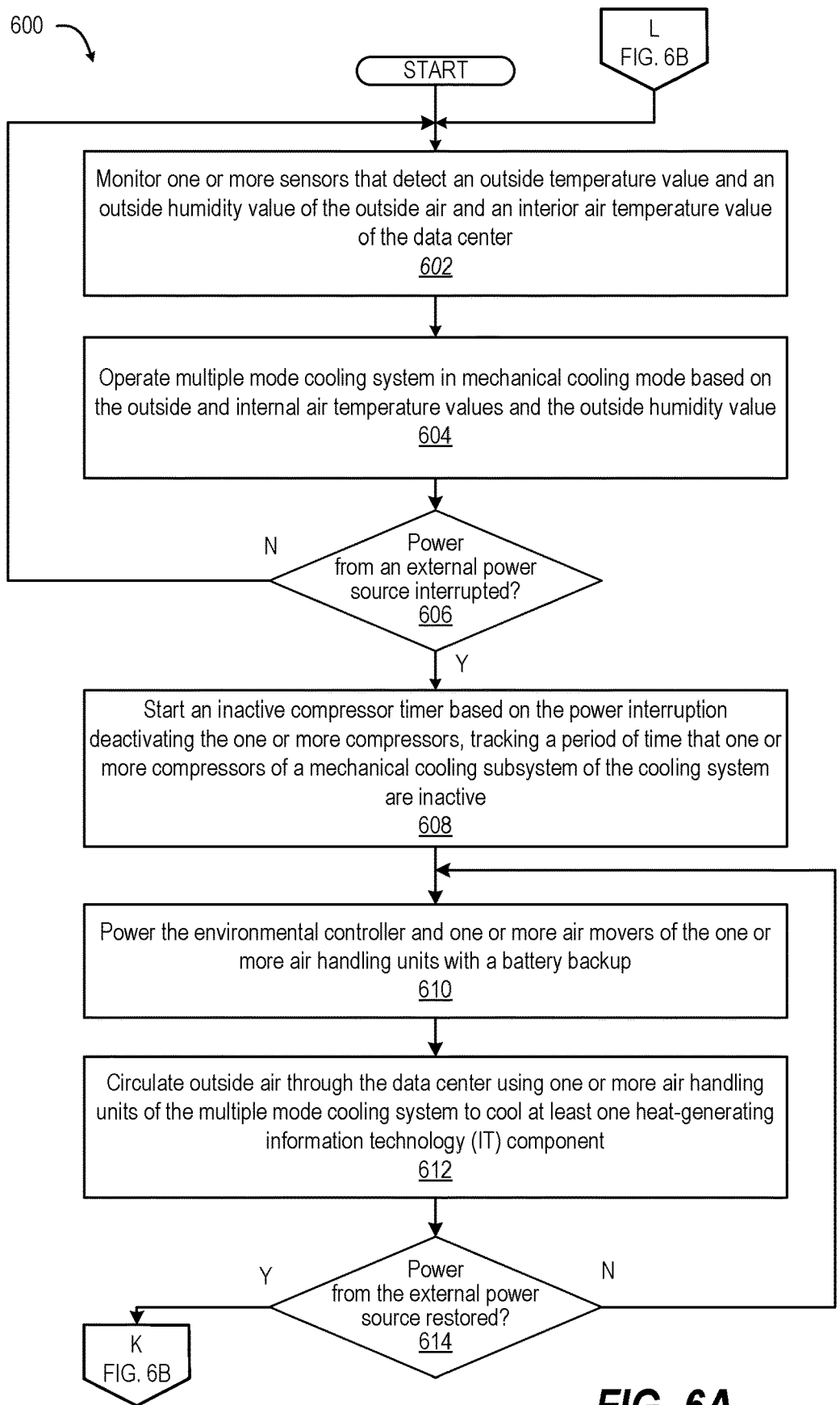
FIGS. 6A-6B (FIG. 6) depict a flow chart illustrating an example method for controlling restart of compressor(s) in a multiple mode cooling system of a data center after a power interruption, according to one or more embodiments.
Figure 6B:
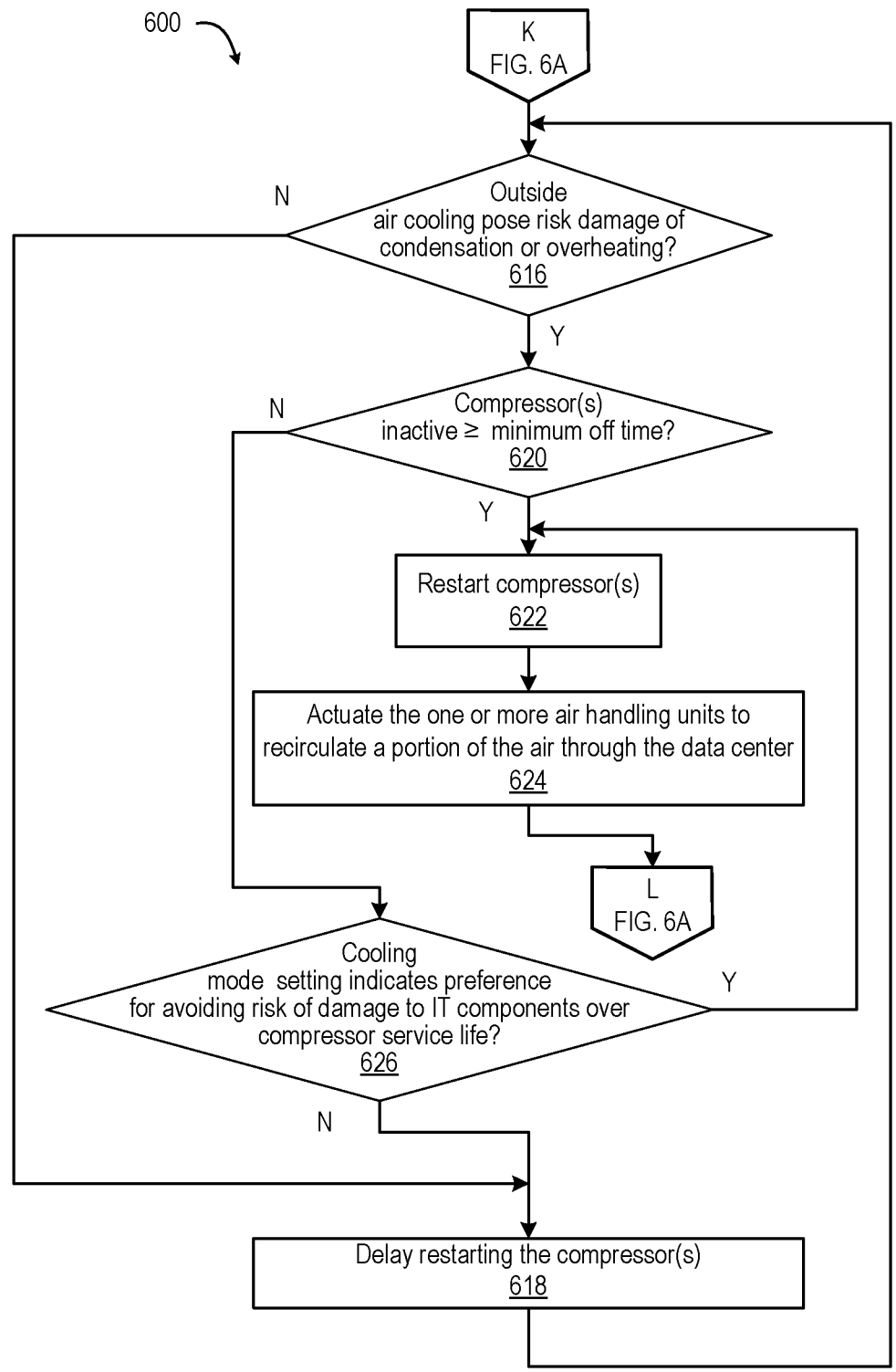

FIGS. 6A-6B (FIG. 6) depict a flow chart illustrating example method 600 for controlling a restart of compressor(s) of multiple mode cooling system 144 of a data center such as MDC 100 (FIG. 1) after a power interruption. The description of the method 600 is provided with general reference to the specific components illustrated within the preceding FIGS. 1-6. In at least one embodiment, method 600 can be implemented using environmental controller 138 (FIG. 1) that operates multiple mode cooling system 144 (FIG. 1). With reference to FIG. 6A, method 600 includes monitoring one or more sensors that detect an outside temperature value and an outside humidity value of the outside air and an interior air temperature value of the data center (block 602). Method 600 includes operating multiple mode cooling system in mechanical cooling mode based on the outside and internal air temperature values and the outside humidity value (block 604). A determination is made, in decision block 606, whether power from an external power source is interrupted. In response to determining that the power is not interrupted, method 600 returns to block 602. In response to determining that the power is interrupted, the environmental controller starts an inactive compressor timer based on the power interruption deactivating the one or more compressors. The inactive compressor timer tracks a period of time that one or more compressors of a mechanical cooling subsystem of the cooling system are inactive (block 608). Method 600 includes powering the environmental controller and one or more air movers of the one or more air handling units with a battery backup (block 610). For power saving, backup power is not made available to compressors. Method 600 includes circulating outside air through the data center using one or more air handling units of the multiple mode cooling system to cool at least one heat-generating information technology (IT) component (block 612). The one or more compressors have a minimum off-time specified for maintaining service life of the one or more compressors. A determination is made, in decision block 614, whether power from the external power source is restored. In response to the power from the external power source not being restored, method 600 returns to block 610.

With reference to FIG. 6B, in response to the power from the external power source being restored, the controller determines, in decision block 616, based on the outside and the interior air temperature values and the outside humidity value received from the one or more sensors, whether outside air cooling poses a risk of damage to the at least one heat-generating IT component. The damage can be due to a selected one of: (i) condensation on the at least one heat-generating IT component; and (ii) overheating of the at least one heat-generating IT component. The risk of damage would be avoidable by using the one or more compressors for mechanical cooling. In response to determining that the outside air cooling does not pose the risk of damage in decision block 616, method 600 includes delaying restarting the compressor(s) (block 618). Then method 600 returns to block 616. In response to determining that the outside air cooling poses the risk of damage, method 600 includes determining, in decision block 620, whether the period of time that the one or more compressors has been inactive is equal to or greater than the minimum off-time. In response to determining that the period of time is equal to or greater than the minimum off-time, method 600 includes restarting the one or more compressors to initiate mechanical cooling (block 622). Method 600 includes actuating the one or more air handling units to recirculate a portion of the air through the data center (block 624). Then method 600 returns to block 602 (FIG. 6A).

In response to determining, in decision block 618, that the period of time is not equal to or greater than the minimum off-time, method 600 includes determining, in decision block 626, whether a cooling mode setting indicates an optimization preference for avoiding the posed risk of damage to the at least one heat-generating IT component over the compressor service life. In response to determining that the cooling mode setting indicates the preference for avoiding the posed risk of damage to the at least one heat-generating IT component over the compressor service life, method 600 includes returning to block 622. In response to determining that the cooling mode setting does not indicate the preference for avoiding the posed risk of damage to the at least one heat-generating IT component over compressor service life, method 600 returns to block 618).

In one or more embodiments, method 600 includes determining whether the outside air cooling poses the risk of damage to the at least one heat-generating IT component by determining that the outside temperature and humidity values have a dew point temperature that is less than the interior air temperature. Method 600 includes determining whether the cooling mode setting indicates the preference for avoiding the posed risk of damage to the at least one heat-generating IT component over a compressor service life by determining whether the cooling mode setting indicates the preference for avoiding condensation on the at least one heat-generating IT component over the compressor service life.

In a particular one or more embodiments, method 600 includes accessing an inventory of the one or more heat-generating IT components. Method 600 includes identifying, based on the inventory, particular ones of the one or more heat-generating IT components that are designated for protecting from condensation. Method 600 includes determining whether the particular ones of the one or more heat-generating IT components are operating at or above a threshold power level that corresponds to a surface temperature of the particular ones of the one or more heat-generating IT component that is above the dew point temperature of the outside air. Method 600 includes disregarding that the internal air temperature is below the dew point temperature in response to determining that the outside air cooling does not pose a risk of damage to the one or more heat-generating IT components. The risk of damage is mitigated based on the surface temperature of one or more heat-generating IT components being above the dew point temperature.

In a particular one or more embodiments, method 600 includes determining whether the outside air cooling poses the risk of damage to the at least one heat-generating IT component by determining whether a cooling requirement of the at least one heat-generating IT component exceeds cooling capacity of the outside air circulated in the data center. Method 600 includes determining whether the cooling mode setting indicates the preference for avoiding the posed risk of damage to the at least one heat-generating IT component over a compressor service life by determining whether the cooling mode setting indicates the preference for maintaining a performance level of the at least one heat-generating IT component over the compressor service life. Method 600 includes, in response to determining that the cooling mode setting does not indicate the preference for performance level of the at least one heat-generating IT component over the compressor service life, throttling the performance of the at least one heat-generating IT component to remain within the cooling capacity of the circulated outside air.

Figure 7A:
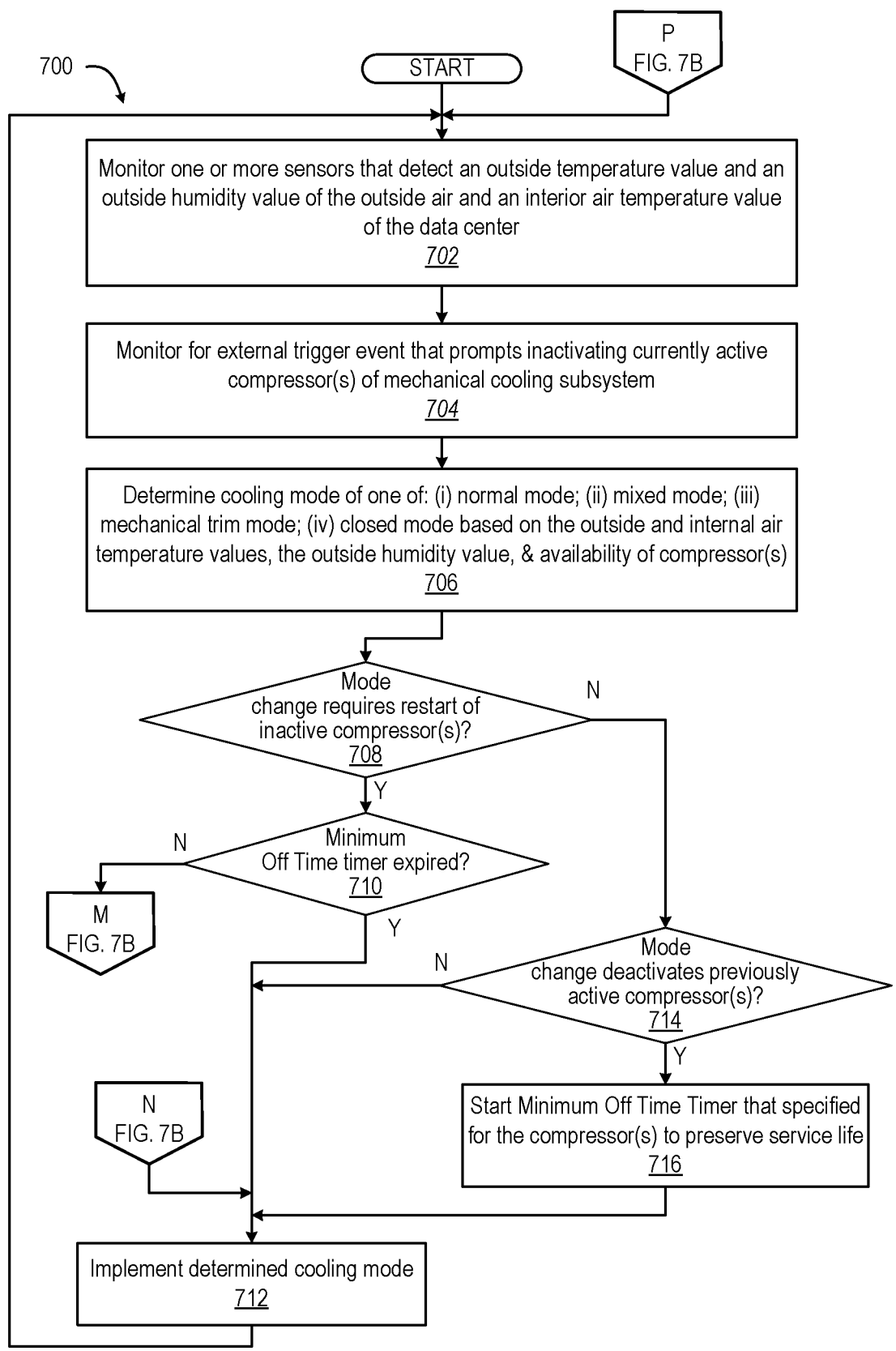
FIGS. 7A-7B (FIG. 7) depict a flow chart illustrating an example method for controlling a compressor restart during cooling mode changes of a multiple mode cooling system of a data center, according to one or more embodiments.
Figure 7B:
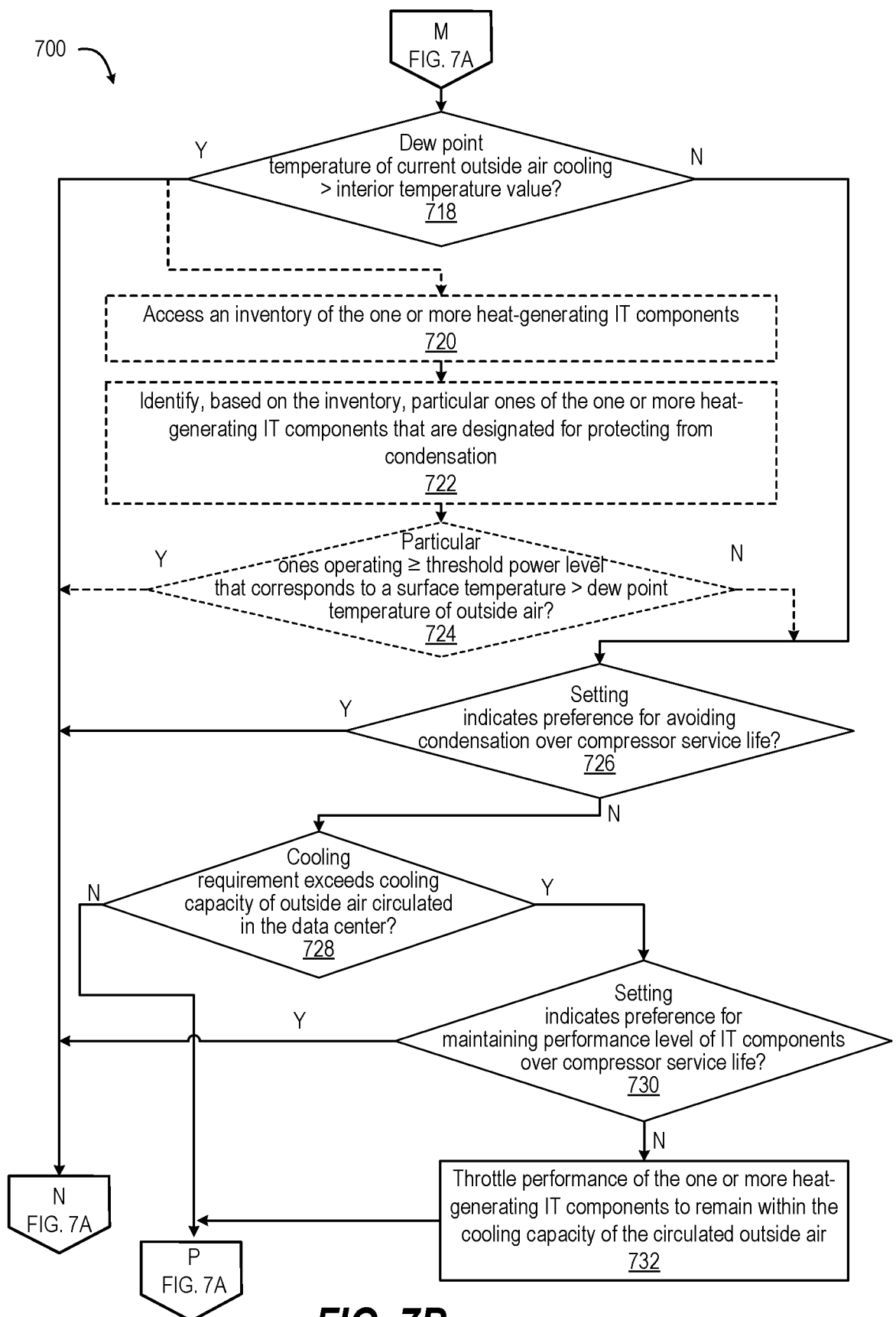

FIGS. 7A-7B (FIG. 7) depict a flow chart illustrating example method 700 for controlling a compressor restart during cooling mode changes of multiple mode cooling system 144 of a data center such as MDC 100 (FIG. 1). The description of the method 700 is provided with general reference to the specific components illustrated within the preceding FIGS. 1-6. In at least one embodiment, method 700 can be implemented using environmental controller 138 (FIG. 1) that operates multiple mode cooling system 144 (FIG. 1). With reference to FIG. 7A, method 700 includes monitoring one or more sensors that detect an outside temperature value and an outside humidity value of the outside air and an interior air temperature value of the data center (block 702). Method 700 includes monitoring for an external trigger event that prompts deactivating currently active compressor(s) of mechanical cooling subsystem (block 704). The external trigger event can be a detected failure that affects the mechanical cooling system. The external trigger event can be a manual selection of a cooling mode. The external trigger event can be a power interruption that briefly removes power from the compressor(s). The external trigger event can be a maintenance profile for the compressor(s) that requires a periodic shutdown to preserve the compressor's service life. Method 700 includes determining a cooling mode from among: (i) normal mode; (ii) mixed mode; (iii) mechanical trim mode; and (iv) closed mode based on the outside and internal air temperature values, the outside humidity value, and availability of compressor(s) (block 706). For example, temperature and humidity ranges can define appropriate cooling modes. A determination is made, in decision block 708, whether mode change requires a restart of an inactive compressor(s). In response to determining that a mode change requires restart of the inactive compressor(s), a determination is made, in decision block 710, whether a minimum off-time timer has expired. In response to determining that the minimum off-time timer has expired, method 700 includes implementing the determined cooling mode (block 712). Then method 700 returns to block 702.

In response to determining, in decision block 708, that mode change is not required that restarts an inactive compressor(s), a determination is made, in decision block 714, whether the mode change deactivates previously active compressor(s). In response to determining that the mode change deactivates previously active compressor(s), method 700 includes starting the minimum off-time timer that is specified for the compressor(s) to preserve service life (block 716). Then method 700 proceeds to block 712. In response to determining that the mode change does not deactivate previously active compressor(s), method 700 proceeds directly to block 712.

Transitioning now to FIG. 7B, in response to determining that the minimum off-time timer has not expired in decision block 710, method 700 includes determining, in decision block 718, whether the dew point temperature of current outside air cooling is greater than the interior temperature value. In response to determining that the dew point temperature of current outside air cooling is not greater than the interior temperature value in decision block 718, method 700 also proceeds to decision block 728.

In one or more embodiments, in response to determining that the dew point temperature of current outside air cooling is greater than the interior temperature value, method 700 includes accessing an inventory of the one or more heat-generating IT components (block 720). Method 700 includes identifying, based on the inventory, particular ones of the one or more heat-generating IT components that are designated for protecting from condensation (block 722). A determination is made, in decision block 724, whether the particular ones of the one or more heat-generating IT components are operating at or above a threshold power level that corresponds to a surface temperature of the particular ones of the one or more heat-generating IT component that is above the dew point temperature of the outside air. In response to determining that the surface temperature is greater than the dew point temperature of the outside air, method 700 proceeds to block 712 (FIG. 7A). The dew point temperature of the outside air being greater than the interior air temperature is mitigated by the surface temperature being too warm for condensation to pose a risk of damage to the at least one heat-generating IT component due to condensation.

In response to determining that the surface temperature is not greater than the dew point temperature of the outside air, method 700 includes determining whether the cooling mode setting indicates the preference for avoiding the posed risk of damage to the at least one heat-generating IT component over compressor service life. In particular, the determination is made, in decision block 726, whether the cooling mode setting indicates the preference for avoiding condensation on the at least one heat-generating IT component over a compressor service life. In response to determining that the setting indicates the preference for avoiding condensation over compressor service life, method 700 proceeds to block 712 (FIG. 7A).

In an alternate embodiment to the one described above, when the interior air temperature is above the dew point temperature of the outside air, the controller does not perform the determinations regarding the surface temperature of the heat-generating IT components. In one or more of these alternate embodiments, the controller does not have access to inventory information and cannot determine whether the surface temperatures of the at least one heat-generating IT component are above the dew point temperature of the outside air. In this instance, the determination in decision block 718 would proceed directly to block 726 for a negative result, skipping optional blocks 720, 722, and 724.

In response to determining that the setting does not indicate the preference for avoiding condensation over compressor service life, method 700 includes determining whether the outside air cooling poses a different risk of damage to the at least one heat-generating IT component. As one particular embodiment, a determination is made, in decision block 728, whether a cooling requirement of the at least one heat-generating IT component exceeds cooling capacity of the outside air circulated in the data center.

In response to determining that the cooling requirement of the at least one heat-generating IT component does not exceed cooling capacity of the outside air circulated in the data center, method 700 proceeds to block 702 (FIG. 7A). The multiple mode cooling system remains in outside air cooling mode and the compressor(s) are not restarted.

In response to determining that the cooling requirement of the at least one heat-generating IT component exceeds the cooling capacity of the outside air circulated in the data center, method 700 includes determining whether the cooling mode setting indicates the preference for avoiding the posed risk of damage to the at least one heat-generating IT component over compressor service life. In particular, a determination is made, in decision block 730, whether the cooling mode setting indicates the preference for maintaining a performance level of the at least one heat-generating IT component over the compressor service life. In response to determining that the cooling mode setting indicates the preference for maintaining a performance level of the at least one heat-generating IT component over compressor service life, method 700 returns to block 712 (FIG. 7A). In response to determining that the cooling mode setting does not indicate the preference for maintaining a performance level of the at least one heat-generating IT component over compressor service life, method 700 includes throttling the performance of the one or more heat-generating IT components to remain within the cooling capacity of the circulated outside air (block 732). Then method 700 returns to block 702 (FIG. 7A).

In the above described flow charts, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method of controlling a multiple mode cooling system of a data center, the method comprising:
    circulating outside air through a data center using one or more air handling units of a cooling system to cool at least one heat-generating information technology (IT) component;
    tracking a period of time that one or more compressors of a mechanical cooling subsystem of the cooling system are inactive, the one or more compressors having a minimum off-time specified for maintaining service life of the one or more compressors;
    monitoring a plurality of sensors that detect respective ones of an outside temperature value, an outside humidity value of the outside air, and an interior air temperature value of the data center;
    based on the outside and the interior air temperature values and the outside humidity value received from respective ones of the plurality of sensors, determining whether outside air cooling poses a risk of damage to the at least one heat-generating IT component due to a selected one of: (i) condensation on the at least one heat-generating IT component; and (ii) overheating of the at least one heat-generating IT component, the risk of damage avoidable by using the one or more compressors for mechanical cooling;
    in response to determining that the outside air cooling poses the risk of damage, determining whether the period of time that the one or more compressors has been inactive is equal to or greater than the minimum off-time;
    in response to determining that the period of time is not equal to or greater than the minimum off-time, determining whether a cooling mode setting indicates an optimization preference for avoiding the posed risk of damage to the at least one heat-generating IT component over compressor service life; and
    in response to determining that the cooling mode setting indicates the preference for avoiding the posed risk of damage to the at least one heat-generating IT component over compressor service life, restarting the one or more compressors to initiate mechanical cooling.

2. The method of claim 1, further comprising powering the controller and one or more air movers of the one or more air handling units with a battery backup in response to a power interruption that deactivates the one or more compressors.

3. The method of claim 1, further comprising restarting the one or more compressors to initiate mechanical cooling in response to determining that the period of time is equal to or greater than the minimum off-time.

4. The method of claim 1, wherein restarting the one or more compressors to initiate mechanical cooling further comprises actuating the one or more air handling units to recirculate a portion of the air through the data center.

5. The method of claim 1, wherein:
    determining whether the outside air cooling poses the risk of damage to the at least one heat-generating IT component comprises determining that the outside temperature and humidity values have a dew point temperature that is less than the interior air temperature; and
    determining whether the cooling mode setting indicates the preference for avoiding the posed risk of damage to the at least one heat-generating IT component over compressor service life comprises determining whether the cooling mode setting indicates the preference for avoiding condensation on the at least one heat-generating IT component over compressor service life.

6. The method of claim 5, further comprising:
    accessing an inventory of the one or more heat-generating IT components;
    identifying, based on the inventory, particular ones of the one or more heat-generating IT components that are designated for protecting from condensation; and
    determining whether the particular ones of the one or more heat-generating IT components are operating at or above a threshold power level that corresponds to a surface temperature of the particular ones of the one or more heat-generating IT component that is above the dew point temperature of the outside air; and determining that the outside air cooling does not pose a risk of damage to the one or more heat-generating IT components based on the surface temperature being above the dew point temperature, disregarding that the internal air temperature is below the dew point temperature.

7. The method of claim 5, further comprising delaying restarting the one or more compressors to initiate mechanical cooling until the minimum off-time elapses in response to determining that the cooling mode setting does not indicate the preference for avoiding condensation on the at least one heat-generating IT component over compressor service life.

8. The method of claim 1, wherein:

determining whether the outside air cooling poses the risk of damage to the at least one heat-generating IT component comprises determining whether a cooling requirement of the at least one heat-generating IT component exceeds cooling capacity of the outside air circulated in the data center; and determining whether the cooling mode setting indicates the preference for avoiding the posed risk of damage to the at least one heat-generating IT component over compressor service life comprises determining whether the cooling mode setting indicates the preference for maintaining a performance level of the at least one heat-generating IT component over compressor service life.

9. The method of claim 8, further comprising, in response to determining that the cooling mode setting does not indicate the preference for performance level of the at least one heat-generating IT component over compressor service life, throttling the performance level of the at least one heat-generating IT component to remain within the cooling capacity of the circulated outside air.

10. A multiple mode cooling system of a data center, the multiple mode cooling system comprising:

one or more air handling units that circulate outside air through a data center to cool at least one heat-generating information technology (IT) component;

one or more compressors of a mechanical cooling subsystem, the one or more compressors having a minimum off-time specified for maintaining service life of the one or more compressors;

a plurality of sensors that detect respective ones of an outside temperature value, an outside humidity value of the outside air, and an interior temperature value of the data center;

a memory containing a minimum off-time value specified for maintaining service life of the one or more compressors and containing a cooling mode application; and a controller that is communicatively coupled to the one or more air handling units, the one or more compressors, the plurality of sensors, and the memory, the controller executing the cooling mode application to enable the data center cooling system to:

circulate outside air through the data center using the one or more air handling units of the multiple mode cooling system to cool the at least one heat-generating IT component;

track a period of time that the one or more compressors of the mechanical cooling subsystem of the cooling system are inactive;

monitor the plurality of sensors;

based on the outside and the interior air temperature values and the outside humidity value received from respective ones of plurality of sensors, determine whether outside air cooling poses a risk of damage to the at least one heat-generating IT component due to a selected one of: (i) condensation on the at least one heat-generating IT component; and (ii) overheating of the at least one heat-generating IT component, the risk of damage avoidable by using the one or more compressors for mechanical cooling;

in response to determining that the outside air cooling poses the risk of damage, determine whether the period of time that the one or more compressors has been inactive is equal to or greater than the minimum off-time;

in response to determining that the period of time is not equal to or greater than the minimum off-time, determine whether a cooling mode setting indicates an optimization preference for avoiding the posed risk of damage to the at least one heat-generating IT component over compressor service life; and in response to determining that the cooling mode setting indicates the preference for avoiding the posed risk of damage to the at least one heat-generating IT component over compressor service life, restart the one or more compressors to initiate mechanical cooling.

11. The multiple mode cooling system of claim 10, wherein the controller executes the cooling mode application to enable the data center cooling system to power the controller and one or more air movers of the one or more air handling units with a battery backup in response to a power interruption that deactivates the one or more compressors.

12. The multiple mode cooling system of claim 10, wherein the controller executes the cooling mode application to enable the data center cooling system to restart the one or more compressors to initiate mechanical cooling in response to determining that the period of time is equal to or greater than the minimum off-time.

13. The multiple mode cooling system of claim 10, wherein, in restarting the one or more compressors to initiate mechanical cooling, the controller executes the cooling mode application to enable the data center cooling system to actuate the one or more air handling units to recirculate a portion of the air through the data center.

14. The multiple mode cooling system of claim 10, wherein the controller executes the cooling mode application to enable the data center cooling system to:

determine whether the outside air cooling poses the risk of damage to the at least one heat-generating IT component by determining that the outside temperature and humidity values have a dew point temperature that is less than the interior air temperature; and determine whether the cooling mode setting indicates the preference for avoiding the posed risk of damage to the at least one heat-generating IT component over compressor service life by determining whether the cooling mode setting indicates the preference for avoiding condensation on the at least one heat-generating IT component over compressor service life.

15. The multiple mode cooling system of claim 14, wherein the controller executes the cooling mode application to enable the data center cooling system to:

access an inventory of the one or more heat-generating IT components;

identify, based on the inventory, particular ones of the one or more heat-generating IT components that are designated for protecting from condensation; and determine whether the particular ones of the one or more heat-generating IT components are operating at or above a threshold power level that corresponds to a surface temperature of the particular ones of the one or more heat-generating IT component that is above the dew point temperature of the outside air; and determine that the outside air cooling does not pose a risk of damage to the one or more heat-generating IT components based on the surface temperature being above the dew point temperature, disregarding that the internal air temperature is below the dew point temperature.

16. The multiple mode cooling system of claim 14, wherein the controller executes the cooling mode application to enable the data center cooling system to delay restarting the one or more compressors to initiate mechanical cooling until the minimum off-time elapses in response to determining that the cooling mode setting does not indicate the preference for avoiding condensation on the at least one heat-generating IT component over compressor service life.

17. The multiple mode cooling system of claim 10, wherein the controller executes the cooling mode application to enable the data center cooling system to:

determine whether the outside air cooling poses the risk of damage to the at least one heat-generating IT component by determining whether a cooling requirement of the at least one heat-generating IT component exceeds cooling capacity of the outside air circulated in the data center; and determine whether the cooling mode setting indicates the preference for avoiding the posed risk of damage to the at least one heat-generating IT component over compressor service life by determining whether the cooling mode setting indicates the preference for maintaining a performance level of the at least one heat-generating IT component over compressor service life.

18. The multiple mode cooling system of claim 17, wherein, in response to determining that the cooling mode setting does not indicate the preference for performance level of the at least one heat-generating IT component over compressor service life, the controller executes the cooling mode application to enable the data center cooling system to throttling the performance level of the at least one heat-generating IT component to remain within the cooling capacity of the circulated outside air.

19. A data center comprising:
a volumetric container;
at least one heat-generating information technology (IT) component positioned in the volumetric container; and
a multiple mode cooling system comprising:
one or more air handling units that circulate outside air through a data center to cool the at least one heat-generating IT component;
one or more compressors of a mechanical cooling subsystem, the one or more compressors having a minimum off-time specified for maintaining service life of the one or more compressors;

a plurality of sensors that detect respective ones of an outside temperature value, an outside humidity value of the outside air, and an interior temperature value of the data center;

a memory containing a minimum off-time value specified for maintaining service life of the one or more compressors and containing a cooling mode application; and a controller that is communicatively coupled to the one or more air handling units, the one or more compressors, the plurality of sensors, and the memory, the controller executing the cooling mode application to enable the data center cooling system to:

circulate outside air through the data center using the one or more air handling units of the multiple mode cooling system to cool the at least one heat-generating IT component;

track a period of time that the one or more compressors of the mechanical cooling subsystem of the cooling system are inactive;

monitor the plurality of sensors for respective ones of outside temperature value, outside humidity value of the outside air, and interior air temperature value of the data center;

based on the outside and the interior air temperature values and the outside humidity value received from the plurality of sensors, determine whether outside air cooling poses a risk of damage to the at least one heat-generating IT component due to a selected one of: (i) condensation on the at least one heat-generating IT component; and (ii) overheating of the at least one heat-generating IT component, the risk of damage avoidable by using the one or more compressors for mechanical cooling;

in response to determining that the outside air cooling poses the risk of damage, determine whether the period of time that the one or more compressors has been inactive is equal to or greater than the minimum off-time;

in response to determining that the period of time is not equal to or greater than the minimum off-time, determine whether a cooling mode setting indicates an optimization preference for avoiding the posed risk of damage to the at least one heat-generating IT component over compressor service life; and in response to determining that the cooling mode setting indicates the preference for avoiding the posed risk of damage to the at least one heat-generating IT component over compressor service life, restart the one or more compressors to initiate mechanical cooling.

* * * * *